(12) United States Patent  
Pawlowski

(10) Patent No.: US 8,359,517 B2  
(45) Date of Patent: *Jan. 22, 2013

(54) MEMORY SYSTEM AND METHOD USING PARTIAL ECC TO ACHIEVE LOW POWER REFRESH AND FAST ACCESS TO DATA

(75) Inventor: J. Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/026,030

(22) Filed: Feb. 11, 2011

(65) Prior Publication Data

US 2011/0138251 A1  Jun. 9, 2011

Related U.S. Application Data

(62) Division of application No. 11/546,692, filed on Oct. 11, 2006, now Pat. No. 7,894,289.

(51) Int. Cl.  
*H03M 13/00* (2006.01)  
*G11C 29/00* (2006.01)

(52) U.S. Cl. ..................... 714/754; 714/773; 714/774

(58) Field of Classification Search .................. 714/773, 714/774, 754  
See application file for complete search history.

(56) References Cited

U.S. PATENT DOCUMENTS

| | | | |
|---|---|---|---|
| 4,006,468 A | 2/1977 | Webster | 340/173 DR |
| 4,334,295 A | 6/1982 | Nagami | 365/222 |
| 4,380,812 A | 4/1983 | Ziegler, II et al. | 371/38 |
| 4,433,211 A | 2/1984 | McCalmont et al. | 179/1.5 S |
| 4,493,081 A | 1/1985 | Schmidt | 371/38 |
| 4,598,402 A | 7/1986 | Matsumoto et al. | 371/38 |
| 4,617,660 A | 10/1986 | Sakamoto | 371/13 |
| 4,694,454 A | 9/1987 | Matsuura | 371/13 |
| 4,706,249 A | 11/1987 | Nakagawa et al. | 371/38 |
| 4,710,934 A | 12/1987 | Traynor | 371/38 |
| 4,766,573 A | 8/1988 | Takemae | 365/222 |
| 4,780,875 A | 10/1988 | Sakai | 371/38 |
| 4,858,236 A | 8/1989 | Ogasawara | 371/38 |
| 4,862,463 A | 8/1989 | Chen | 371/38 |
| 4,888,773 A * | 12/1989 | Arlington et al. | 714/764 |
| 4,918,692 A | 4/1990 | Hidaka et al. | 371/2.2 |
| 4,937,830 A | 6/1990 | Kawashima et al. | 371/40.1 |
| 4,958,325 A | 9/1990 | Nakagome et al. | 365/206 |
| 5,012,472 A * | 4/1991 | Arimoto et al. | 714/754 |
| 5,033,026 A * | 7/1991 | Tsujimoto | 365/222 |
| 5,056,089 A | 10/1991 | Furuta et al. | 371/3 |
| 5,127,014 A | 6/1992 | Raynham | |
| 5,172,339 A | 12/1992 | Noguchi et al. | 365/201 |

(Continued)

OTHER PUBLICATIONS

Idei et al., "Dual-Period Self-Refresh Scheme for Low Power DRAMs with On-Chip Prom Mode Register", IEEE, 1998, Journal of Solid-State Circuits, pp. 253-259.*

(Continued)

*Primary Examiner* — Joseph D Torres  
(74) *Attorney, Agent, or Firm* — Dorsey & Whitney LLP

(57) ABSTRACT

A DRAM memory device includes several banks of memory cells each of which are divided into first and second sets of memory cells. The memory cells in the first set can be refreshed at a relatively slow rate to reduce the power consumed by the DRAM device. Error checking and correcting circuitry in the DRAM device corrects any data retention errors in the first set of memory cells caused by the relatively slow refresh rate. The memory cells in the second set are refreshed at a normal rate, which is fast enough that data retention errors do not occur. A mode register in the DRAM device may be programmed to select the size of the second set of memory cells.

12 Claims, 4 Drawing Sheets

U.S. PATENT DOCUMENTS

| | | | |
|---|---|---|---|
| 5,208,782 A * | 5/1993 | Sakuta et al. | 365/230.03 |
| 5,278,796 A | 1/1994 | Tillinghast et al. | 365/211 |
| 5,291,498 A | 3/1994 | Jackson et al. | 371/40.1 |
| 5,307,356 A | 4/1994 | Fifield | 371/40.1 |
| 5,313,425 A | 5/1994 | Lee et al. | 365/201 |
| 5,313,464 A | 5/1994 | Reiff | 371/2.1 |
| 5,313,475 A | 5/1994 | Cromer et al. | 371/40.1 |
| 5,313,624 A | 5/1994 | Harriman et al. | 395/575 |
| 5,321,661 A | 6/1994 | Iwakiri et al. | 365/222 |
| 5,331,601 A * | 7/1994 | Parris | 365/230.08 |
| 5,335,201 A | 8/1994 | Walther et al. | 365/222 |
| 5,369,651 A | 11/1994 | Marisetty | 371/40.1 |
| 5,418,796 A | 5/1995 | Price et al. | 371/39.1 |
| 5,428,630 A | 6/1995 | Weng et al. | 371/40.1 |
| 5,432,802 A | 7/1995 | Tsuboi | 371/40.1 |
| 5,446,695 A | 8/1995 | Douse et al. | 365/222 |
| 5,448,578 A | 9/1995 | Kim | 371/40.4 |
| 5,450,424 A | 9/1995 | Okugaki et al. | 371/40.1 |
| 5,455,801 A | 10/1995 | Blodgett et al. | 365/222 |
| 5,459,742 A | 10/1995 | Cassidy et al. | 371/40.1 |
| 5,481,552 A | 1/1996 | Aldereguia et al. | 371/40.1 |
| 5,509,132 A | 4/1996 | Matsuda et al. | 395/403 |
| 5,513,135 A | 4/1996 | Dell et al. | 365/52 |
| 5,515,333 A | 5/1996 | Fujita et al. | |
| 5,588,112 A | 12/1996 | Dearth et al. | 395/182.07 |
| 5,600,662 A | 2/1997 | Zook | 371/40.1 |
| 5,604,703 A | 2/1997 | Nagashima | 365/200 |
| 5,623,506 A | 4/1997 | Dell et al. | 371/40.1 |
| 5,629,898 A * | 5/1997 | Idei et al. | 365/222 |
| 5,631,914 A | 5/1997 | Kashida et al. | 371/37.4 |
| 5,644,545 A * | 7/1997 | Fisch | 365/222 |
| 5,703,823 A | 12/1997 | Douse et al. | 365/222 |
| 5,706,225 A | 1/1998 | Buchenrieder et al. | 365/102 |
| 5,712,861 A | 1/1998 | Inoue et al. | 371/37.1 |
| 5,732,092 A | 3/1998 | Shinohara | 371/40.2 |
| 5,740,188 A | 4/1998 | Olarig | 371/40.11 |
| 5,742,554 A | 4/1998 | Fujioka | 365/222 |
| 5,754,753 A | 5/1998 | Smelser | 395/182.06 |
| 5,761,222 A | 6/1998 | Baldi | 371/40.18 |
| 5,765,185 A | 6/1998 | Lambrache et al. | 711/103 |
| 5,784,328 A | 7/1998 | Irrinki et al. | 365/222 |
| 5,784,391 A | 7/1998 | Konigsburg | 371/40.18 |
| 5,808,952 A * | 9/1998 | Fung et al. | 365/222 |
| 5,841,418 A | 11/1998 | Bril et al. | 345/3 |
| 5,864,569 A | 1/1999 | Roohparvar | 371/40.18 |
| 5,878,059 A | 3/1999 | Maclellan | 371/40.13 |
| 5,896,404 A | 4/1999 | Kellogg et al. | 371/40.11 |
| 5,909,404 A | 6/1999 | Schwarz | 365/201 |
| 5,912,906 A | 6/1999 | Wu et al. | 371/40.11 |
| 5,953,278 A | 9/1999 | McAdams et al. | 365/219 |
| 5,961,660 A | 10/1999 | Capps, Jr. et al. | 714/763 |
| 5,963,103 A | 10/1999 | Blodgett | 331/75 |
| 6,009,547 A | 12/1999 | Jaquette et al. | 714/758 |
| 6,009,548 A | 12/1999 | Chen et al. | 714/762 |
| 6,018,817 A | 1/2000 | Chen et al. | 714/762 |
| 6,041,001 A | 3/2000 | Estakhri | 365/200 |
| 6,041,430 A | 3/2000 | Yamauchi | 714/752 |
| 6,052,815 A | 4/2000 | Zook | 714/758 |
| 6,078,543 A | 6/2000 | Kim | 365/230.03 |
| 6,085,283 A | 7/2000 | Toda | |
| 6,085,334 A | 7/2000 | Giles et al. | 714/7 |
| 6,092,231 A | 7/2000 | Sze | 714/758 |
| 6,101,614 A | 8/2000 | Gonzales et al. | 714/6 |
| 6,125,467 A | 9/2000 | Dixon | 714/763 |
| 6,134,167 A | 10/2000 | Atkinson | 365/222 |
| 6,137,739 A | 10/2000 | Kim | 365/205 |
| 6,166,980 A | 12/2000 | Chun | 365/222 |
| 6,178,537 B1 | 1/2001 | Roohparvar | 714/773 |
| 6,199,139 B1 | 3/2001 | Katayama et al. | 711/106 |
| 6,212,118 B1 | 4/2001 | Fujita | 365/222 |
| 6,212,631 B1 | 4/2001 | Springer et al. | 713/1 |
| 6,216,246 B1 | 4/2001 | Shau | 714/763 |
| 6,216,247 B1 | 4/2001 | Creta et al. | 714/763 |
| 6,219,807 B1 | 4/2001 | Ebihara et al. | 714/720 |
| 6,223,309 B1 | 4/2001 | Dixon et al. | 714/703 |
| 6,233,717 B1 | 5/2001 | Choi | 714/805 |
| 6,262,925 B1 | 7/2001 | Yamasaki | 365/200 |
| 6,279,072 B1 | 8/2001 | Williams et al. | 711/105 |
| 6,310,825 B1 | 10/2001 | Furuyama | 365/233 |
| 6,324,119 B1 | 11/2001 | Kim | 365/233 |
| 6,349,068 B2 | 2/2002 | Takemae et al. | 365/222 |
| 6,349,390 B1 | 2/2002 | Dell et al. | 714/6 |
| 6,353,910 B1 | 3/2002 | Carnevale et al. | 714/763 |
| 6,397,290 B1 | 5/2002 | Williams et al. | 711/105 |
| 6,397,357 B1 | 5/2002 | Cooper | 714/703 |
| 6,397,365 B1 | 5/2002 | Brewer et al. | 714/766 |
| 6,404,687 B2 * | 6/2002 | Yamasaki | 365/222 |
| 6,426,908 B1 | 7/2002 | Kidaka | 365/222 |
| 6,438,066 B1 | 8/2002 | Ooishi et al. | 365/233 |
| 6,442,644 B1 | 8/2002 | Gustavson et al. | 711/105 |
| 6,457,153 B2 | 9/2002 | Yamamoto et al. | 714/763 |
| 6,484,246 B2 | 11/2002 | Tsuchida et al. | 711/169 |
| 6,487,136 B2 | 11/2002 | Hidaka | 365/222 |
| 6,510,537 B1 | 1/2003 | Lee | 714/763 |
| 6,518,595 B2 | 2/2003 | Lee | 257/66 |
| 6,526,537 B2 | 2/2003 | Kishino | 714/763 |
| 6,545,899 B1 | 4/2003 | Derner et al. | 365/94 |
| 6,549,460 B2 | 4/2003 | Nozoe et al. | 365/185.09 |
| 6,556,497 B2 | 4/2003 | Cowles et al. | 365/222 |
| 6,557,072 B2 | 4/2003 | Osborn | 711/106 |
| 6,560,155 B1 | 5/2003 | Hush | 365/222 |
| 6,570,803 B2 | 5/2003 | Kyung | 365/222 |
| 6,584,543 B2 | 6/2003 | Williams et al. | 711/105 |
| 6,591,394 B2 | 7/2003 | Lee et al. | 714/766 |
| 6,594,796 B1 | 7/2003 | Chiang | 714/800 |
| 6,601,211 B1 | 7/2003 | Norman | 714/773 |
| 6,603,694 B1 * | 8/2003 | Frankowsky et al. | 365/222 |
| 6,603,696 B2 | 8/2003 | Janzen | 365/222 |
| 6,603,697 B2 | 8/2003 | Janzen | 365/222 |
| 6,603,698 B2 | 8/2003 | Janzen | 365/222 |
| 6,609,236 B2 | 8/2003 | Watanabe et al. | 716/8 |
| 6,614,698 B2 | 9/2003 | Ryan et al. | 365/189.04 |
| 6,618,281 B1 | 9/2003 | Gordon | 365/49 |
| 6,618,314 B1 | 9/2003 | Fiscus et al. | 365/227 |
| 6,618,319 B2 | 9/2003 | Ooishi et al. | 365/233 |
| 6,628,558 B2 | 9/2003 | Fiscus | 365/222 |
| 6,633,509 B2 * | 10/2003 | Scheuerlein et al. | 365/230.03 |
| 6,636,444 B2 | 10/2003 | Uchida et al. | 365/189.05 |
| 6,636,446 B2 | 10/2003 | Lee et al. | 365/194 |
| 6,646,942 B2 | 11/2003 | Janzen | 365/222 |
| 6,662,333 B1 | 12/2003 | Zhang et al. | 714/767 |
| 6,665,231 B2 | 12/2003 | Mizuno et al. | 365/233 |
| 6,678,860 B1 | 1/2004 | Lee | 714/763 |
| 6,681,332 B1 | 1/2004 | Byrne et al. | 713/300 |
| 6,697,926 B2 | 2/2004 | Johnson et al. | 711/167 |
| 6,697,992 B2 * | 2/2004 | Ito et al. | 714/763 |
| 6,701,480 B1 | 3/2004 | Karpuszka et al. | 714/764 |
| 6,704,230 B1 * | 3/2004 | DeBrosse et al. | 365/201 |
| 6,715,104 B2 | 3/2004 | Imbert de Tremiolles et al. | 714/25 |
| 6,715,116 B2 | 3/2004 | Lester et al. | 714/718 |
| 6,721,223 B2 * | 4/2004 | Matsumoto et al. | 365/222 |
| 6,735,726 B2 * | 5/2004 | Muranaka et al. | 714/708 |
| 6,751,143 B2 | 6/2004 | Morgan et al. | 365/222 |
| 6,754,858 B2 | 6/2004 | Borkenhagen et al. | 714/720 |
| 6,775,190 B2 | 8/2004 | Setogawa | 365/193 |
| 6,778,457 B1 * | 8/2004 | Burgan | 365/222 |
| 6,781,908 B1 | 8/2004 | Pelley et al. | 365/222 |
| 6,785,837 B1 | 8/2004 | Kilmer et al. | 714/7 |
| 6,788,616 B2 | 9/2004 | Takahashi | 365/233 |
| 6,789,209 B1 | 9/2004 | Suzuki et al. | 713/401 |
| 6,792,567 B2 | 9/2004 | Laurent | 714/763 |
| 6,795,362 B2 | 9/2004 | Nakai et al. | 365/222 |
| 6,799,291 B1 | 9/2004 | Kilmer et al. | 714/722 |
| 6,807,108 B2 | 10/2004 | Maruyama et al. | 365/189.05 |
| 6,810,449 B1 | 10/2004 | Barth et al. | 710/61 |
| 6,819,589 B1 * | 11/2004 | Aakjer | 365/185.02 |
| 6,819,624 B2 | 11/2004 | Acharya et al. | 365/233 |
| 6,834,022 B2 | 12/2004 | Derner et al. | 365/222 |
| 6,920,523 B2 | 7/2005 | Le et al. | 711/106 |
| 6,934,199 B2 | 8/2005 | Johnson et al. | 365/194 |
| 6,940,773 B2 * | 9/2005 | Poechmueller | 365/222 |
| 6,940,774 B2 * | 9/2005 | Perner | 365/222 |
| 6,944,074 B2 | 9/2005 | Chung et al. | 365/200 |
| 6,965,537 B1 * | 11/2005 | Klein et al. | 365/222 |
| 7,002,397 B2 * | 2/2006 | Kubo et al. | 327/534 |
| 7,027,337 B2 | 4/2006 | Johnson et al. | 365/194 |

| Patent/Pub. No. | Kind | Date | Inventor | Class |
|---|---|---|---|---|
| 7,051,260 | B2 * | 5/2006 | Ito et al. | 714/754 |
| 7,095,669 | B2 | 8/2006 | Oh | 365/222 |
| 7,096,407 | B2 | 8/2006 | Olarig | 714/768 |
| 7,099,221 | B2 | 8/2006 | Klein | 365/222 |
| 7,116,602 | B2 | 10/2006 | Klein | 365/222 |
| 7,117,420 | B1 | 10/2006 | Yeung et al. | 714/763 |
| 7,149,141 | B2 | 12/2006 | Johnson et al. | 365/226 |
| 7,167,403 | B2 * | 1/2007 | Riho et al. | 365/200 |
| 7,171,605 | B2 | 1/2007 | White | 714/763 |
| 7,184,351 | B2 * | 2/2007 | Ito et al. | 365/222 |
| 7,184,352 | B2 * | 2/2007 | Klein et al. | 365/222 |
| 7,190,628 | B2 * | 3/2007 | Choi et al. | 365/222 |
| 7,216,198 | B2 * | 5/2007 | Ito et al. | 711/106 |
| 7,225,390 | B2 * | 5/2007 | Ito et al. | 714/777 |
| 7,231,488 | B2 * | 6/2007 | Poechmueller | 711/106 |
| 7,249,289 | B2 * | 7/2007 | Muranaka et al. | 714/48 |
| 7,254,067 | B2 | 8/2007 | Johnson et al. | 365/194 |
| 7,269,085 | B2 * | 9/2007 | Sohn et al. | 365/222 |
| 7,272,066 | B2 | 9/2007 | Klein | |
| 7,272,773 | B2 | 9/2007 | Cargnoni et al. | 714/763 |
| 7,277,345 | B2 | 10/2007 | Klein | |
| 7,280,386 | B2 | 10/2007 | Klein | |
| 7,317,648 | B2 * | 1/2008 | Jo | 365/222 |
| 7,318,183 | B2 * | 1/2008 | Ito et al. | 714/754 |
| 7,340,668 | B2 | 3/2008 | Klein | |
| 7,372,749 | B2 * | 5/2008 | Poechmueller | 365/200 |
| 7,444,577 | B2 * | 10/2008 | Best et al. | 714/745 |
| 7,447,973 | B2 | 11/2008 | Klein | |
| 7,447,974 | B2 | 11/2008 | Klein | |
| 7,453,758 | B2 * | 11/2008 | Hoffmann | 365/230.04 |
| 7,461,320 | B2 | 12/2008 | Klein | |
| 7,478,285 | B2 * | 1/2009 | Fouquet-Lapar | 714/42 |
| 7,493,531 | B2 * | 2/2009 | Ito et al. | 714/708 |
| 7,500,171 | B2 | 3/2009 | Suzuki | 714/763 |
| 7,558,142 | B2 | 7/2009 | Klein | 365/222 |
| 2001/0023496 | A1 | 9/2001 | Yamamoto et al. | 714/763 |
| 2001/0029592 | A1 | 10/2001 | Walker et al. | 714/42 |
| 2001/0044917 | A1 | 11/2001 | Lester et al. | 714/718 |
| 2001/0052090 | A1 | 12/2001 | Mio | 714/42 |
| 2001/0052102 | A1 | 12/2001 | Roohparvar | 714/773 |
| 2002/0013924 | A1 | 1/2002 | Yamasoto | 714/763 |
| 2002/0029316 | A1 | 3/2002 | Williams et al. | 711/105 |
| 2002/0144210 | A1 | 10/2002 | Borkenhagen et al. | 714/805 |
| 2002/0152444 | A1 | 10/2002 | Chen et al. | 714/785 |
| 2002/0162069 | A1 | 10/2002 | Laurent | 714/763 |
| 2002/0184592 | A1 | 12/2002 | Koga et al. | 714/763 |
| 2003/0009721 | A1 | 1/2003 | Hsu et al. | 714/773 |
| 2003/0070054 | A1 | 4/2003 | Williams et al. | 711/173 |
| 2003/0093744 | A1 | 5/2003 | Leung et al. | 714/763 |
| 2003/0097608 | A1 | 5/2003 | Rodeheffer et al. | 714/7 |
| 2003/0101405 | A1 | 5/2003 | Shibata | 714/763 |
| 2003/0128612 | A1 | 7/2003 | Moore et al. | 365/222 |
| 2003/0149855 | A1 | 8/2003 | Shibata et al. | 711/200 |
| 2003/0167437 | A1 | 9/2003 | DeSota et al. | 714/763 |
| 2003/0191888 | A1 | 10/2003 | Klein | 711/105 |
| 2004/0008562 | A1 | 1/2004 | Ito et al. | 365/223 |
| 2004/0064646 | A1 | 4/2004 | Emerson et al. | 711/131 |
| 2004/0083334 | A1 | 4/2004 | Chang et al. | 711/103 |
| 2004/0098654 | A1 | 5/2004 | Cheng et al. | 714/758 |
| 2004/0117723 | A1 | 6/2004 | Foss | 714/805 |
| 2004/0205429 | A1 | 10/2004 | Yoshida et al. | 714/718 |
| 2004/0225944 | A1 | 11/2004 | Brueggen | 714/758 |
| 2005/0099868 | A1 | 5/2005 | Oh | 365/222 |
| 2005/0146958 | A1 | 7/2005 | Moore et al. | 365/203 |
| 2005/0249010 | A1 | 11/2005 | Klein | |
| 2005/0289444 | A1 | 12/2005 | Klein | 714/793 |
| 2006/0010339 | A1 | 1/2006 | Klein | 714/5 |
| 2006/0013052 | A1 | 1/2006 | Klein | |
| 2006/0044913 | A1 | 3/2006 | Klein | 365/222 |
| 2006/0056259 | A1 | 3/2006 | Klein | 365/222 |
| 2006/0056260 | A1 | 3/2006 | Klein | 365/222 |
| 2006/0069856 | A1 | 3/2006 | Klein | 711/106 |
| 2006/0152989 | A1 | 7/2006 | Klein | 365/222 |
| 2006/0158949 | A1 | 7/2006 | Klein | 365/222 |
| 2006/0158950 | A1 | 7/2006 | Klein | 365/222 |
| 2006/0206769 | A1 | 9/2006 | Klein | 714/52 |
| 2006/0218469 | A1 | 9/2006 | Klein | 714/763 |
| 2007/0268756 | A1 | 11/2007 | Johnson et al. | 365/189.01 |
| 2008/0002503 | A1 | 1/2008 | Klein | |
| 2008/0092016 | A1 | 4/2008 | Pawlowski | |
| 2008/0109705 | A1 | 5/2008 | Pawlowski et al. | |
| 2008/0151671 | A1 | 6/2008 | Klein | |
| 2009/0067267 | A1 | 3/2009 | Johnson et al. | 365/191 |
| 2011/0038217 | A1 | 2/2011 | Johnson et al. | 365/189.16 |

OTHER PUBLICATIONS

Stojko, J. et al., *"Error-Correction Code"*, IBM Technical Disclosure Bulletin, vol. 10, No. 10, Mar. 1968.

Youji Idei et al; *"Dual-Period Self-Refresh Scheme for Low-Power DRAM's with On-Chip PROM Mode Register"*; IEEE Journal of Solid State Circuits, vol. 33, No. 2, Feb. 1998, pp. 253-259.

* cited by examiner

MEMORY SYSTEM AND METHOD USING PARTIAL ECC TO ACHIEVE LOW POWER REFRESH AND FAST ACCESS TO DATA

CROSS-REFERENCE TO RELATED APPLICATION

This application is a divisional of U.S. patent application Ser. No. 11/546,692, filed Oct. 11, 2006. This application is incorporated by reference herein in its entirety and for all purposes.

TECHNICAL FIELD

This invention relates to dynamic random access memory ("DRAM") devices, and, more particularly, to a method and system for operating a memory system in a low power mode while allowing frequently accessed data to be quickly accessed.

BACKGROUND OF THE INVENTION

As the use of electronic devices, such as personal computers, continues to increase, it is becoming ever more important to make such devices portable. The usefulness of portable electronic devices, such as notebook computers, is limited by the limited length of time batteries are capable of powering the device before needing to be recharged. This problem has been addressed by attempts to increase battery life and attempts to reduce the rate at which such electronic devices consume power.

Various techniques have been used to reduce power consumption in electronic devices, the nature of which often depends upon the type of power consuming electronic circuits that are in the device. For example, electronic devices such a notebook computer, typically include dynamic random access memory ("DRAM") devices that consume a substantial amount of power. As the data storage capacity and operating speeds of DRAM devices continue to increase, the power consumed by such devices has continued to increase in a corresponding manner. Therefore, many attempts to reduce the power consumed by an electronic device have focused on reducing the power consumption of DRAM devices.

In general, the power consumed by a DRAM device increases with both the capacity and the operating speed of the DRAM devices. The power consumed by DRAM devices is also affected by their operating mode. A DRAM device for example, will generally consume a relatively large amount of power when the memory cells of the DRAM device are being refreshed. As is well-known in the art, DRAM memory cells, each of which essentially consists of a capacitor, must be periodically refreshed to retain data stored in the DRAM device. Refresh is typically performed by essentially reading data bits from the memory cells in each row of a memory cell array and then writing those same data bits back to the same cells in the row. A relatively large amount of power is consumed when refreshing a DRAM because rows of memory cells in a memory cell array are being actuated in the rapid sequence. Each time a row of memory cells is actuated, a pair of digit lines for each memory cell are switched to complementary voltages and then equilibrated. As a result, DRAM refreshes tend to be particularly power-hungry operations. Further, since refreshing memory cells must be accomplished even when the DRAM is not being used and is thus inactive, the amount of power consumed by refresh is a critical determinant of the amount of power consumed by the DRAM over an extended period. Thus many attempts to reduce power consumption in DRAM devices have focused on reducing the rate at which power is consumed during refresh.

Refresh power can, of course, be reduced by reducing the rate at which the memory cells in a DRAM are being refreshed. However, reducing the refresh rate increases the risk that data stored in the DRAM memory cells will be lost. More specifically, since, as mentioned above, DRAM memory cells are essentially capacitors, charge inherently leaks from the memory cell capacitors, which can change the value of a data bit stored in the memory cell over time. However, current leaks from capacitors at varying rates. Some capacitors are essentially short-circuited and are thus incapable of storing charge indicative of a data bit. These defective memory cells can be detected during production testing, and can then be repaired by substituting non-defective memory cells using conventional redundancy circuitry. On the other hand, current leaks from most DRAM memory cells at much slower rates that span a wide range. A DRAM refresh rate is chosen to ensure that all but a few memory cells can store data bits without data loss. This refresh rate is typically once every 64 ms. The memory cells that cannot reliably retain data bits at this refresh rate are detected during production testing and replaced by redundant memory cells.

One technique that has been used to prevent data errors during refresh as well as at other times is to generate an error correcting code "ECC," which is known as a "syndrome," from each item of stored data, and then store the syndrome along with the data. When the data are read from the memory device, the syndrome is also read, and it is then used to determine if any bits of the data are in error. As long as not too many data bits are in error, the syndrome may also be used to correct the read data. Some DRAM devices include a mode register that may be set to selectively operate the DRAM device in either a normal mode or an ECC mode.

The use of ECC techniques can allow DRAM devices to be refreshed at a slower refresh rate since resulting data bit errors can be corrected. The use of a slower refresh rate can provide the significant advantage of reducing the power consumed by DRAM devices. Prior to entering a reduced power refresh mode, each item of data is read. A syndrome corresponding to the read data is then generated and stored in the DRAM device. When exiting the reduced power refresh mode, the each item of data and each corresponding syndrome are read from the DRAM device. The read syndrome is then used to determine if the item of read data is in error. If the item of read data is found to be in error, the read syndrome is used to correct the read item of data, and the incorrect item of data is then overwritten with the corrected item of data.

The use of the above-described ECC techniques to allow refresh at a relatively low rate can markedly reduce the power consumed by DRAM device in many applications, particularly where the DRAM device is not being accessed for an extended period. However, if the DRAM device is being frequently accessed, the power consumed in reading syndromes and data, using the read syndromes to check and possibly correct the read data, and writing any corrected data to the DRAM device can exceed the power saved by using ECC techniques to refresh at a reduced rate. Moreover, it can require a considerable period of time to exit the reduced power refresh mode when using ECC techniques as described above, thus preventing data stored in the DRAM device from being quickly accessed. As a result, there are many applications where a reduced power refresh mode using ECC techniques are not practical.

For example, one application in which reduced power consumption is very important, but access to a DRAM device is frequent, is in the field of cellular telephones. DRAM devices are frequently used in cellular telephones to store a variety of data, such as paging protocols, text messages, image data, etc. When the cellular telephone is powered but a telephone call is not currently active, the cellular telephone is essentially inactive. During such periods of inactivity, almost all of the data stored in the DRAM device is not being accessed. However, a small portion of the data stored in the DRAM device must be accessed any time power is applied to the cellular telephone. For example, data corresponding to a paging protocol must be accessed to determine if a call is being made to the cellular telephone. The protocol data is accessed during each paging period which occurs on a periodic basis, such as once every one-half second. During the paging period, the cellular telephone uses the protocol data to transmit a probe, which is received by one or more cellular sites that are in range of the cellular telephone. A cellular site then transmits a message back to the cellular telephone if an incoming call to the cellular telephone is being made.

The need for at least some data stored in DRAM devices to be frequently and immediately available makes it impractical to use the previously described ECC techniques to reduce power in an extended refresh mode. The use of such techniques would require the DRAM device to enter and exit the reduced power refresh mode every paging period, which, as mentioned above, is on the order of once every one-half second. As a result, the read data stored in the DRAM device might not be accessible when the data were needed, particularly if the DRAM device contains a large number of memory cells. Even if the DRAM device could enter and exit the reduced power refresh mode at a sufficient rate, the time required to enter and exit the reduced power refresh mode might very well reduce the duration of the reduced power refresh period to the extent that very little power was saved. As a result, DRAM devices used in cellular telephones generally are operated with faster refresh rates than otherwise needed as a result of the need for the entire device to become active so that the protocol data can be accessed every paging period. However, doing so causes the cellular telephones to consume substantial power, thereby reducing the useful life of batteries powering cellular telephones before a recharge is needed.

There is therefore a need for a memory system and method that is effective in allowing a DRAM device to operate in a reduced power refresh mode using ECC techniques, but does so in a manner that does not delay access to data stored in the DRAM or minimize the benefits of operating in the reduced power refresh mode.

SUMMARY OF THE INVENTION

An error checking and correcting semiconductor device and method performs a reduced power refresh using ECC techniques only for memory cells that store infrequently accessed data. The memory cells that store this infrequently accessed data may be refreshed at a relatively low rate, thereby substantially reducing the power consumed by the semiconductor device. Memory cells that store frequently accessed data may be refreshed at a normal rate that does not require ECC techniques to ensure data integrity. As a result, this frequently accessed data is immediately available without the need to enter and exit the reduced power refresh mode. In the event most of the data stored in the semiconductor device are accessed infrequently, the power saved can approach the power savings that are achieved by placing the entire semiconductor device in the reduced power refresh mode. When used in a cellular telephone, most of the memory cells in the semiconductor device are refreshed in the reduced power refresh mode since the data stored therein are only accessed when a call is received. Data corresponding to the paging protocol, which must be accessed each paging period, are stored in memory cells that are refreshed at the normal rate. As a result, the protocol data is immediately available, and power is not consumed every paging period by entering and exiting the reduced power refresh mode for such data.

DETAILED DESCRIPTION

Figure 1:
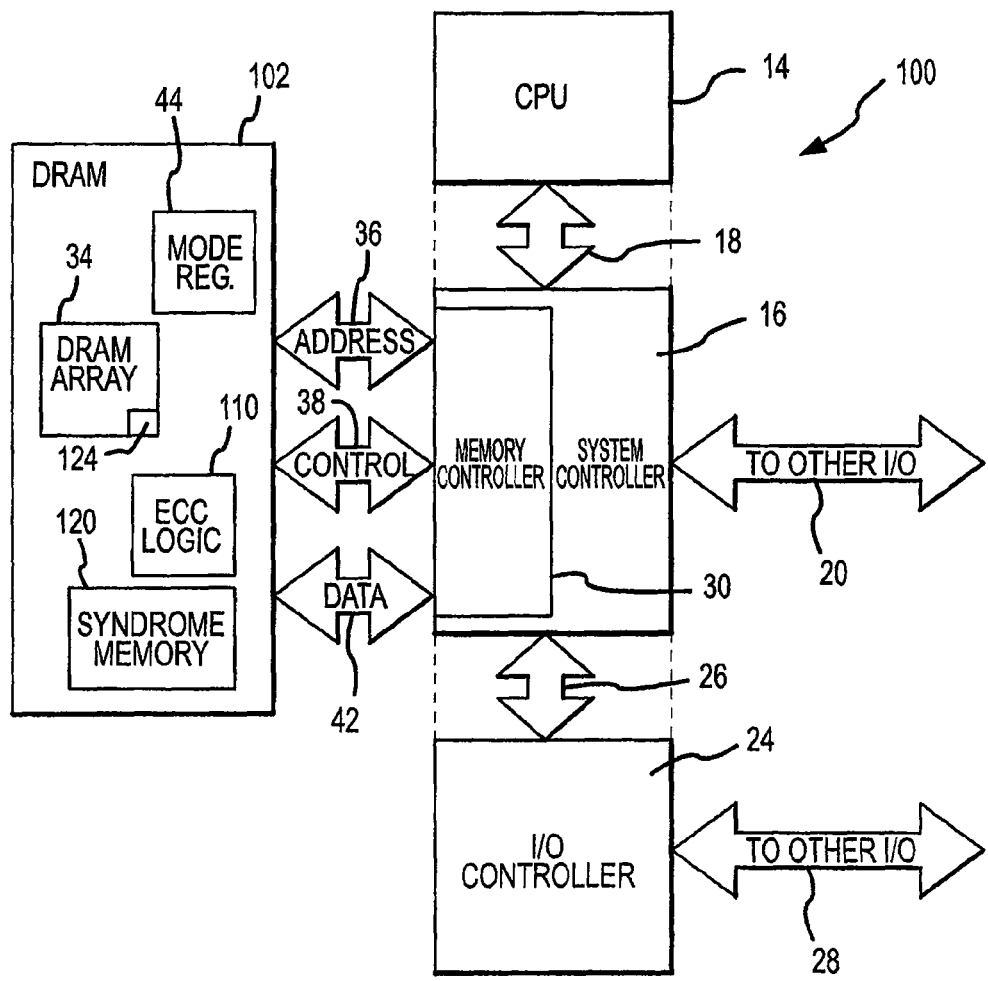
FIG. 1 is a block diagram of a computer system according to one embodiment of the invention.

A computer system 100 according to one embodiment of the invention is shown in FIG. 1. The computer system 100 includes a central processor unit ("CPU") 14 coupled to a system controller 16 through a processor bus 18. The system controller 16 is coupled to input/output ("I/O") devices (not shown) through a peripheral bus 20 and to an I/O controller 24 through an expansion bus 26. The I/O controller 24 is also connected to various peripheral devices (not shown) through another I/O bus 28.

The system controller 16 includes a memory controller 30 that is coupled to a dynamic random access memory ("DRAM") device 102 through an address bus 36, a control bus 38, and a data bus 42. The locations in the DRAM device 102 to which data are written and data are read are designated by addresses coupled to the DRAM device 102 on the address bus 36. The operation of the DRAM device 102 is controlled by control signals coupled to the DRAM device 102 on the control bus 38.

In other embodiments of the invention, the memory controller 30 may be coupled to several DRAM devices or to one or more memory modules (not shown) through the address bus 36, the control bus 38, and the data bus 42. Each of the memory modules would normally contain several of the DRAM devices 102.

With further reference to FIG. 1, the DRAM device 102 includes a mode register 44, a syndrome memory 120, a DRAM array 34, and ECC logic 110. The ECC logic 110 generates a syndrome from write data received from the memory controller 30, and stores the syndrome in the syndrome memory 120 while the write data are being stored in the DRAM array 34. When data are read from the DRAM device 102, the read data are coupled from DRAM array 34 to the ECC logic 110, and the syndrome is coupled from the syndrome memory 120 to the ECC logic 110. The ECC logic 110 then uses the syndrome to determine if the read data contains an erroneous data bit, and, if more than one data bit is not in error, to correct the erroneous data bit. The corrected read data are then coupled to the memory controller 30 through the data bus 42. Although the syndrome memory 120 may be a separate memory array in the DRAM device 102 as shown in FIG. 1, it may alternatively be included in the same array of DRAM cells that are used to store data, as explained in greater detail below. As explained above, the use of ECC allows the refresh rate of the memory cells in the DRAM array 34 to be reduced to a rate at which some data retention errors can occur since such errors can be corrected using the syndromes stored in the syndrome memory 120 and the ECC logic 110.

As explained in greater detail below, the mode register 44 in the DRAM device 102 includes one or more bits that can be set to partition a region 124 of the DRAM array 34 of various sizes for exclusion from operation in the low power, reduced refresh rate mode using ECC techniques. The partitioned memory region 124 is refreshed at the normal refresh rate that is selected to ensure that data retention errors do not occur. As a result, the data read from the DRAM array 34 in the partitioned region 124 is immediately available to the CPU 14 through the memory controller 30 without the need to first read a corresponding ECC syndrome and then use the syndrome to check and possibly correct data read from the DRAM array 34. The area of the DRAM array 34 not in the partitioned memory region 124 can be refreshed at a reduced rate using ECC techniques to correct any data errors resulting from the reduced refresh rate. In the event the partitioned memory region 124 is a relatively small portion of the DRAM array 34, the reduction in power consumption resulting from refreshing the remainder of the DRAM array 34 at the reduced rate can approach the power savings resulting from operating the entire DRAM array 34 at the reduced refresh rate using ECC techniques.

Although the memory system 100 shown in FIG. 1 uses the mode register 44 in the DRAM device 102 to select whether the DRAM array 34 will be partitioned as described above, and, if so, the size of the partitioned region 124, it should be understood that other means may be used. For example, data could be written to the DRAM array 34 itself that specifies whether the DRAM array 34 should be partitioned, and, if so, the size of the partitioned region 124. Other techniques may also be used.

In operation, prior to the DRAM device 102 entering a low power refresh mode, the DRAM device performs a read and syndrome generating operation for all regions of the DRAM array 34 that is not in the partitioned region 124. More specifically, the mode register 44 is first accessed to determine if a region of the DRAM array 34 is to be partitioned, and, if so the size of the partitioned region 124. The ECC logic 110 is then enabled by suitable means, such as by coupling a command signal to the DRAM device 102 through the memory controller 30 and control bus 38 that enables a control register in the DRAM device 102. However, the CPU 14 may enable the ECC logic 110 by other means, such as by coupling control signals directly to the ECC logic 110, by coupling an unsupported command to the DRAM device 102, use of a specific sequence of operations, or by other means. In any case, once the ECC logic 110 has been enabled, the CPU 14 performs a read operation to the regions of the memory array 34 that are outside of the partitioned region 124. The read operation is preferably performed in a burst read mode to minimize the time required for the read operation. During the read operation, the DRAM device 102 generates syndromes from the read data, and stores the syndromes in the syndrome memory 120. The DRAM device 102 then enters a low power refresh mode in which the memory cells in the array 34 outside of the partitioned region 124 are refreshed at a rate that is sufficiently low that data retention errors may occur. This rate is preferably at least twice as slow as the rate at which memory cells in the partitioned region 124 of the array 34 are refreshed. The memory cells in the partitioned region 124 of the array 34 are refreshed at a normal rate that is generally sufficient for no data retention errors to occur. In one embodiment of the invention, the CPU 14 leaves the ECC logic 110 enabled during the low power refresh mode to correct any data retention errors as they occur. In another embodiment of the invention, the CPU 14 disables the ECC logic 110 after all of the syndromes have been stored and before entering the low power refresh mode. In this embodiment, the CPU 14 corrects any data retention errors that have occurred when exiting the low power refresh mode.

When exiting the low power refresh mode, the DRAM device 102 performs a read and correct operation for all regions of the DRAM array 34 that are not in the partitioned region 124. More specifically, the CPU 14 enables the ECC logic 110 if it was not enabled during the refresh mode. The CPU 14 then reads data from the memory array 34 outside of the partitioned region 124, again preferably using a burst read mode. During these read operations, the ECC logic 110 receives the read data from the memory array 34 and the corresponding syndromes from the syndrome memory 120. The ECC logic 110 then uses the syndromes to check the read data and to correct any errors that are found. The ECC logic 110 then writes the corrected data to the memory array 34. Once the regions of the memory array 34 outside of the partitioned region 124 have been read, the refresh rate for that region is increased to the normal refresh rate that has been used for the partitioned region 124. The CPU 14 can disable the ECC logic 110.

In other embodiments of the invention, the CPU 14 initiates a read operation prior to entering the low power refresh mode, but the actual reading of data from the protected areas is accomplished by sequencer logic (not shown) in the DRAM device 102 or in a memory module containing DRAM device 102. The operation of the sequencer logic could be initiated by commands from the CPU 14 other than a read command, such as by issuing commands for a "dummy" operation, i.e., an operation that is not actually implemented by the DRAM device 34.

In still another embodiment of the invention, the data stored in memory array 34 outside of the partitioned region 124 are not checked and corrected when exiting the low power refresh mode. Instead, the ECC mode remains active during normal operation, and the data stored in the memory array 34 outside of the partitioned region 124 are checked using the stored syndromes whenever that data are read during normal operation. This embodiment requires that the syndrome memory 120 remain powered during normal operation, at least until all of the data stored in the memory array 34 outside of the partitioned region 124 have been read. Other techniques may also be used.

Figure 2:
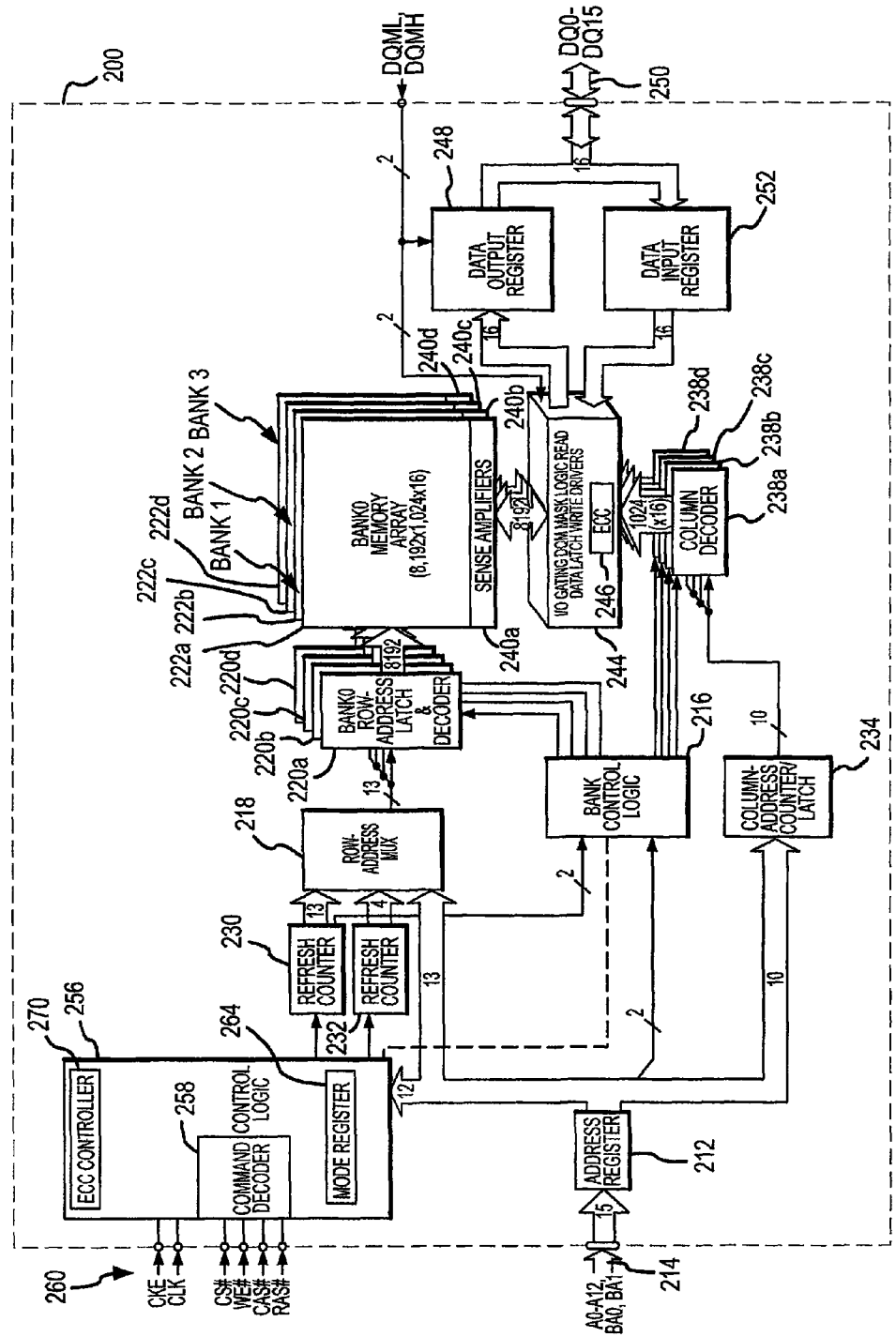
FIG. 2 is a block diagram of a memory device according to one embodiment of the invention that may be used in the computer system of FIG. 1.

A synchronous DRAM ("SDRAM") 200 according to one embodiment of the invention is shown in FIG. 2. The SDRAM 200 includes an address register 212 that receives bank addresses, row addresses and column addresses on an address bus 214. The address bus 214 is generally coupled to a memory controller like the memory controller 30 shown in FIG. 1. Typically, a bank address is received by the address register 212 and is coupled to bank control logic 216 that generates bank control signals, which are described further below. The bank address is normally coupled to the SDRAM 200 along with a row address. The row address is received by the address register 212 and applied to a row address multiplexer 218. The row address multiplexer 218 couples the row address to row address latch & decoder circuit 220a-d for each of several banks of memory cell arrays 222a-d, respectively.

One of the latch & decoder circuits 220a-d is enabled by a control signal from the bank control logic 216 depending on which bank of memory cell arrays 222a-d is selected by the bank address. The selected latch & decoder circuit 220 applies various signals to its respective bank 222 as a function of the row address stored in the latch & decoder circuit 220. These signals include word line voltages that activate respective rows of memory cells in the banks 222*a-d*.

The row address multiplexer 218 also couples row addresses to the row address latch & decoder circuits 220*a-d* for the purpose of refreshing the memory cells in the banks 222*a-d*. The row addresses are generated for refresh purposes by a pair of refresh counters 230, 232. During operation in the low power, reduced refresh rate mode described above, the refresh counter 230 periodically increments to output row addresses for rows in the banks 222*a-d* outside of a partitioned region of one or more of the banks 222*a-d*. The refresh counter 230 causes the memory cells in the banks 222*a-d* outside of a partitioned region to be refreshed at a rate that is sufficiently low that data errors are likely to occur. The refresh of the memory cells in the banks 222*a-d* outside of the partitioned region may be performed at intervals as long as 1 to 3 seconds depending on the design and fabrication of the SDRAM 200. Refreshing the memory cells at this low rate causes relatively little power to be consumed during self-refresh. The refresh counter 232 periodically increments to output row addresses for rows in the partitioned region in one or more of the banks 222*a-d* at a normal refresh rate that generally does not result in data retention errors. The refresh of the memory cells in the partitioned region is typically performed every 64 ms.

After the bank and row addresses have been applied to the address register 212, a column address is applied to the address register 212. The address register 212 couples the column address to a column address counter/latch circuit 234. The counter/latch circuit 234 stores the column address, and, when operating in a burst mode, generates column addresses that increment from the received column address. In either case, either the stored column address or incrementally increasing column addresses are coupled to column address & decoders 238*a-d* for the respective banks 222*a-d*. The column address & decoders 238*a-d* apply various signals to respective sense amplifiers 240*a-d* through column interface circuitry 244. The column interface circuitry 244 includes conventional I/O gating circuits, DQM mask logic, read data latches for storing read data from the memory cells in the banks 222*a-d* and write drivers for coupling write data to the memory cells in the banks 222*a-d*.

The column interface circuitry 244 also includes an ECC generator/checker 246 that essentially performs the same function as the ECC logic 110 in the DRAM 102 of FIG. 1. The ECC generator/checker 246 may be implemented by conventional means, such as by chains of exclusive OR gates implementing a Hamming code. Syndromes corresponding to the data stored in the memory cells in the banks 222*a-d* outside of the partitioned region may be stored in one or more of the banks 222*a-d*. When data are read from the memory cells of the banks 222*a-d* outside of the partitioned region, the corresponding syndrome is also read and then coupled to the ECC generator/checker 246. Data read from one of the banks 222*a-d* outside the partitioned region are sensed by the respective set of sense amplifiers 240*a-d* and then checked and, if necessary, corrected, by the ECC generator/checker 246. The data are then coupled to a data output register 248, which applies the read data to a data bus 250. Data read from one of the banks 222*a-d* in the partitioned region are sensed by the respective set of sense amplifiers 240*a-d* and then coupled to the data bus 250 through the data output register 248 without being processed by the ECC generator/checker 246.

Data to be written to the memory cells in one of the banks 222*a-d* outside of the partitioned region are coupled from the data bus 250 through a data input register 252 to the ECC generator/checker 246, which generates a corresponding syndrome. The write data and the corresponding syndrome are then coupled to write drivers in the column interface circuitry 244, which couple the data and syndrome to the memory cells in one of the banks 222*a-d*. Data to be written to the memory cells in the partitioned region of one or more of the banks 222*a-d* are coupled from the data bus 250 through a data input register 252 directly to the write drivers in the column interface circuitry 244 without interfacing with the ECC generator/checker 246. A data mask signal "DQM" may be applied to the column interface circuitry 244 and the data output register 248 to selectively alter the flow of data into and out of the column interface circuitry 244, such as by selectively masking data to be read from the banks of memory cell arrays 222*a-d*.

The above-described operation of the SDRAM 200 is controlled by control logic 256, which includes a command decoder 258 that receives command signals through a command bus 260. These high level command signals, which are typically generated by a memory controller such as the memory controller 30 of FIG. 1, are a clock a chip select signal CS#, a write enable signal WE#, a column address strobe signal CAS#, and a row address strobe signal RAS#, with the "#" designating the signal as active low. Various combinations of these signals are registered as respective commands, such as a read command or a write command. The control logic 256 also receives a clock signal CLK and a clock enable signal CKE, which allow the SDRAM 200 to operate in a synchronous manner. The control logic 256 generates a sequence of control signals responsive to the command signals to carry out the function (e.g., a read or a write) designated by each of the command signals. The control logic 256 also applies signals to the refresh counter 230 to control the operation of the refresh counter 230 during refresh of the memory cells in the banks 222. The control signals generated by the control logic 256, and the manner in which they accomplish their respective functions, are conventional. Therefore, in the interest of brevity, a further explanation of these control signals will be omitted.

The control logic 256 also includes a mode register 264 that may be programmed by signals coupled through the command bus 260 during initialization of the SDRAM 200. The mode register 264 then generates mode control signals that are used by the control logic 256 to control the operation of the SDRAM 200 in various modes. One or more bits of the mode register 264 are refresh mode bits that, when set, causes the SDRAM 200 to partition the banks 222*a-d* for operation in a normal refresh mode as described above while the remainder of the banks 222*a-d* operate in a low power, reduced refresh rate mode using ECC techniques.

Finally, the control logic 256 also includes an ECC controller 270 that causes the control logic 256 to issue control signals to the ECC generator/checker 246 and other components to generate syndromes for storage in the banks 222*a-d*, and to check and correct data read from the banks 222*a-d* outside the partitioned region using the stored syndromes. The ECC controller 270 is enabled by signals from the mode register 264 to control the operation of the SDRAM 200 in the low power, reduced refresh rate mode. If a single bit in the mode register 264 is used, the mode register simply enables or disables the use of a fixed partition for refresh at the normal rate and the remainder of the banks 222*a-d* for refresh at the reduced rate using ECC techniques. If multiple bits of the mode register 264 are used, one bit enables or disables the low power, reduced refresh mode, and the remaining bits are used to specify the size of the partitioned region of the banks 222a-d that will be refreshed at the normal rate. For example, if two bits of the mode register 264 are used, the bits might be decoded as follows:

"00"—Normal Mode
"01"—Low Power Mode with 1 Mb partition
"10"—Low Power Mode with 2 Mb partition
"11"—Low Power Mode with 4 Mb partition.

Other arrangements may also be used. Furthermore, as pointed out with respect to the computer system 100 of FIG. 1, other techniques not involving the mode register 264 may be used to enable or disable the low power refresh mode and to set the size of a partitioned region of memory that will be refreshed at the normal rate.

Figure 3:
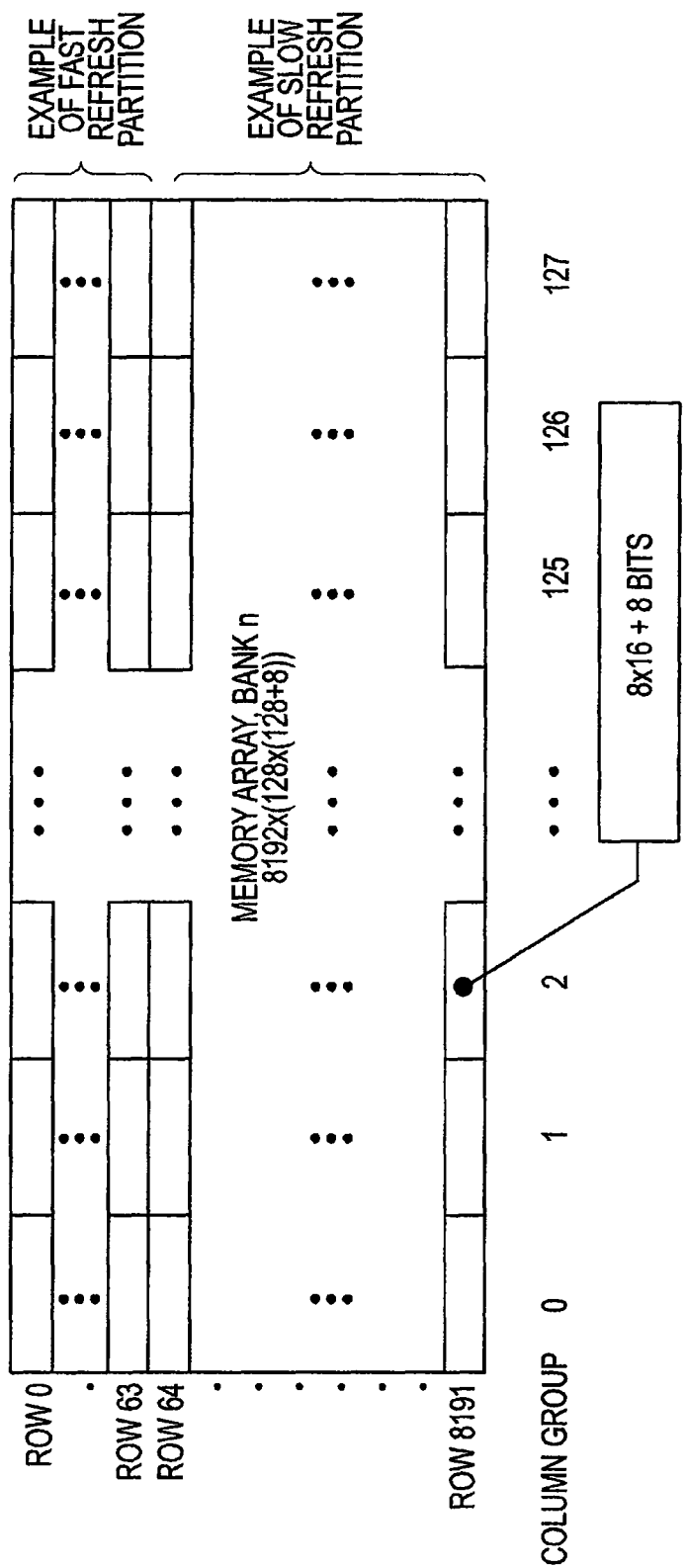
FIG. 3 is a memory map showing the logical ordering of address space in the memory device of FIG. 2.

Although the SDRAM device 200 can have a variety of configurations, in one embodiment the address space of the SDRAM device 200 is logically organized as shown in FIG. 3, although the physical configuration of the SDRAM device 200 will be somewhat different. As shown in FIG. 3, each row contains 128 column groups, and each column group contains 128 bits of data arranged as 8 16-bit words plus an additional 8 bits that are used to store the ECC syndrome. Therefore, each logical row includes 17,408 bits of data, i.e., the product of the 128 data bits plus 8 ECC bits in each column group and the 128 column groups in each row. In one embodiment of the SDRAM device 200 having 64 rows in each bank 222a-d, each row contains 1,114,112 memory cells, i.e., the product of 17,408 memory cells in each row and 64 rows. Insofar as each column group contains 136 bits, i.e., 128 data bits and 8 ECC bits, there are 8,192 column groups in each of the banks 222a-d, i.e. 1,114,112 memory cells divided by 136 bits. Each of these 8,192 column groups can be partitioned for refresh in the low power, reduced refresh rate mode. In one embodiment, the banks 222a-d are partitioned as follows:

Bank 222a
Partition 1—8192 rows×128 columns (8 bits each)=1 Mb
Partition 2—8192 rows×128 columns (8 bits each)=1 Mb
Partition 3—16384 rows×128 columns (8 bits each)=2 Mb
Non-Partitioned—1015808 rows×128 columns (8 bits each)=124 Mb
Bank 222b
Non-Partitioned—1048576 rows×128 columns (8 bits each)=128 Mb
Bank 222c
Non-Partitioned—1048576 rows×128 columns (8 bits each)=128 Mb
Bank 222d
Non-Partitioned—1048576 rows×128 columns (8 bits each)=128 Mb In another embodiment of the invention, the partitioned in the banks 222a-d are implemented in a symmetrical manner, as follows:

Bank 222a
Partition 1—8192 rows×128 columns (8 bits each)=1 Mb
Partition 2—8192 rows×128 columns (8 bits each)=1 Mb
Partition 3—16384 rows×128 columns (8 bits each)=2 Mb
Non-Partitioned—1015808 rows×128 columns (8 bits each)=124 Mb
Bank 222b
Partition 1—8192 rows×128 columns (8 bits each)=1 Mb
Partition 2—8192 rows×128 columns (8 bits each)=1 Mb
Partition 3—16384 rows×128 columns (8 bits each)=2 Mb
Non-Partitioned—1015808 rows×128 columns (8 bits each)=124 Mb
Bank 222c
Partition 1—8192 rows×128 columns (8 bits each)=1 Mb
Partition 2—8192 rows×128 columns (8 bits each)=1 Mb
Partition 3—16384 rows×128 columns (8 bits each)=2 Mb
Non-Partitioned—1015808 rows×128 columns (8 bits each)=124 Mb
Bank 222d
Partition 1—8192 rows×128 columns (8 bits each)=1 Mb
Partition 2—8192 rows×128 columns (8 bits each)=1 Mb
Partition 3—16384 rows×128 columns (8 bits each)=2 Mb
Non-Partitioned—1015808 rows×128 columns (8 bits each)=124 Mb This symmetrical partitioning has the advantage of allowing multi-bank operation during the paging operation. Other partitioning arrangements can, of course, be used.

Figure 4:
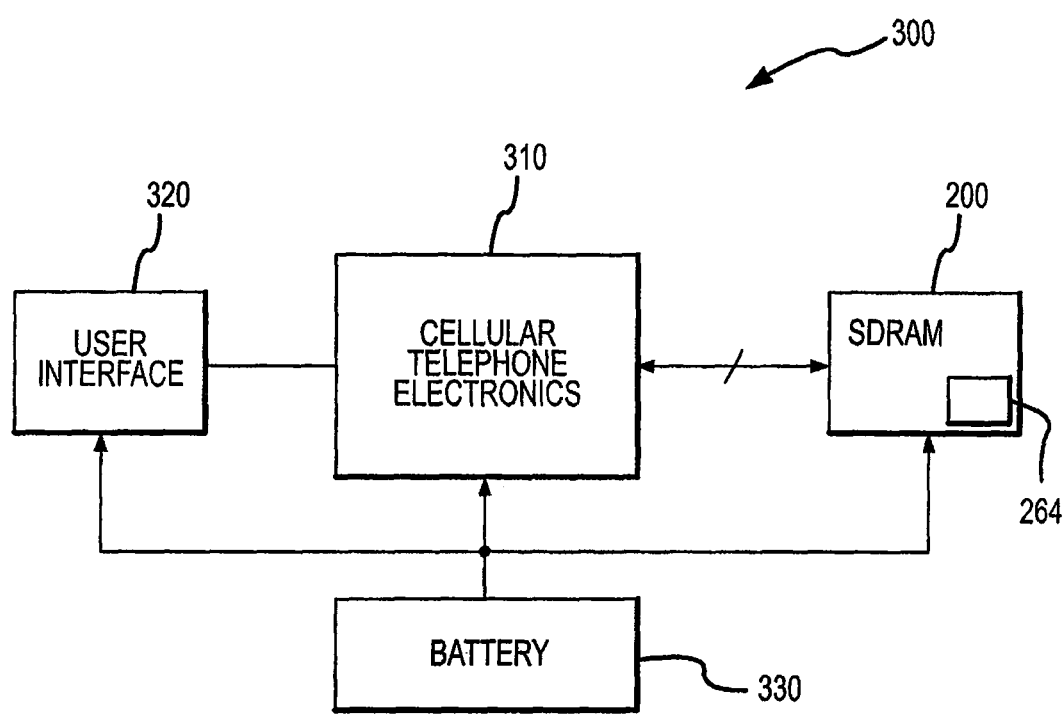
FIG. 4 is a block diagram of a cellular telephone that uses the memory device of FIG. 2.

FIG. 4 is a block diagram of a cellular telephone 300 according to one embodiment of the invention. The cellular telephone 300 includes cellular telephone electronics 310 of conventional design, which normally access a memory device to store paging protocols and other information. However, the cellular telephone electronics 310 shown in FIG. 4 accesses the SDRAM 200 shown in FIG. 2. The cellular telephone electronics 310 initially program the mode register 264 with a mode bit to enable the low power, reduced refresh rate using ECC techniques, as described above. The cellular telephone electronics 310 also program the mode register 264 with one or more bits to set the size of the partitioned region in the banks 222a-d of memory cells. The size of the partitioned region to store paging protocols and any other frequently accessed data is typically 1-2 Mb. The cellular telephone 300 includes user interface devices 320 coupled to the cellular telephone electronics 310 to allow a user to make telephone calls, provide and receive information, take photographs, etc. The cellular telephone electronics 310 typically includes at least a keyboard, a display, a microphone, and an earphone. The cellular telephone 300 also includes a battery 330 connected to the cellular telephone electronics 310 and the SDRAM 200 to supply operating power. Because of the relatively low power consumed by the SDRAM 200 using the low power, reduced refresh rate mode, the battery 330 has a relatively long operating life between recharges.

Although the present invention has been described with reference to the disclosed embodiments, persons skilled in the art will recognize that changes may be made in form and detail without departing from the spirit and scope of the invention. For example, although the reduced power refresh mode has been described in the context of a self-refresh reduced power mode, it will be understood that it may also be used in other refresh modes. Other variations will also be apparent to one skilled in the art. Accordingly, the invention is not limited except as by the appended claims.

I claim:

1. A memory device, comprising:
an array of memory cells;
a read data path configured to couple read data from selected memory cells to a plurality of data bus terminals;
a write data path configured to couple write data from the plurality of data bus terminals to selected memory cells;
refresh circuitry configured to refresh memory cells in the array storing data of a first type at a first rate in a reduced power refresh mode, the refresh circuitry further configured to refresh memory cells in the array storing data of a second type at a second rate that is faster than the first rate in the reduced power refresh mode;
control logic configured to cause the write data to be coupled from the data bus terminals to the array of memory cells and to cause the read data to be coupled from the array of memory cells to the data bus terminals; and an error checking and correcting system coupled to the array of memory cells and configured to correct data retention errors that arise in the memory cells storing data of the first type.

2. The memory device of claim 1 wherein the error checking and correcting system comprises error checking and correcting logic coupled to the read data path and the write data path, the error checking and correcting logic configured to generate an error checking and correcting syndrome from data written to the memory cells storing data of the first type, the error checking and correcting logic further configured to use the syndrome to check and correct data read from the memory cells storing data of the first type.

3. The memory device of claim 2 wherein the control logic is further configured to cause the generated syndromes to be written to the array of memory cells when the corresponding data are written to the memory cells storing data of the first type, the control logic further configured to cause the generated syndromes to be read from the array of memory cells and coupled to the error checking and correcting logic when the corresponding data are read from the memory cells storing data of the first type.

4. The memory device of claim 1 wherein the reduced power refresh mode comprises a self-refresh mode.

5. The memory device of claim 1 wherein the refresh circuitry further comprises the error checking and correcting system, and wherein the error checking and correcting system is further configured to generate a syndrome corresponding to data written to the memory cells storing data of the first type and to store the syndrome in the array of memory cells, the error checking and correcting system further being operable to read the stored syndrome corresponding to the data being read from the memory cells storing data of the first type, and to use the syndrome to correct errors in the data.

6. The memory device of claim 1 wherein the refresh circuitry comprises a first refresh counter configured to generate memory addresses for the memory cells storing data of the first type, and a second refresh counter configured to generate memory addresses for the memory cells storing data of the second type, the second refresh counter being incremented at a rate that is faster than the rate at which the first refresh counter is incremented.

7. The memory device of claim 1 wherein the control logic further comprises a mode register that includes refresh mode bits that can be programmed to select the size of the memory cells storing data of the second type.

8. The memory device of claim 1 wherein the memory cells in the array comprise dynamic random access memory cells.

9. The memory device of claim 1 further comprising an address decoder configured to receive memory addresses, the address decoder further configured to activate the selected memory cells corresponding to each received memory address.

10. The memory device of claim 9 wherein the array of memory cells is arranged in rows and columns, wherein the memory addresses include row addresses and column addresses, and wherein the selected memory cells correspond with a row of memory cells corresponding to each received row address a memory cell in a column of memory cells corresponding to each received column address.

11. The memory device of claim 1, wherein the second rate is significantly faster than the first rate.

12. The memory device of claim 1, wherein the refresh circuitry is further configured to refresh the memory cells in the array storing data of a first type at a third rate in a normal refresh mode, the refresh circuitry further configured to refresh the memory cells in the array at a fourth rate on the normal refresh mode, wherein the third and fourth rates are both faster than the first rate.

* * * * *